(12) United States Patent
Otani

(10) Patent No.: US 6,963,134 B2
(45) Date of Patent: Nov. 8, 2005

(54) SEMICONDUCTOR SENSOR WITH SUBSTRATE HAVING A CERTAIN ELECTRIC POTENTIAL

(75) Inventor: Hiroshi Otani, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/214,594

(22) Filed: Aug. 9, 2002

(65) Prior Publication Data

US 2003/0047804 A1   Mar. 13, 2003

(30) Foreign Application Priority Data

Sep. 10, 2001   (JP) ............................... 2001-273542

(51) Int. Cl.[7] ................... H01L 23/06; H01L 23/34; H01L 23/48; H01L 23/52; H01L 29/40

(52) U.S. Cl. .................. 257/723; 257/684; 257/725; 257/782

(58) Field of Search ................ 257/684, 723, 257/724, 725, 782, 784, 666, 685, 676, 696, 257/698, 691, 203, 207, 208, 693

(56) References Cited

U.S. PATENT DOCUMENTS

| | | | | |
|---|---|---|---|---|
| 3,696,154 A | * | 10/1972 | Anderson et al. | 568/45 |
| 5,604,363 A | * | 2/1997 | Ichihashi | 257/274 |
| 5,864,062 A | * | 1/1999 | Nagahara et al. | 73/514.01 |
| 5,872,393 A | * | 2/1999 | Sakai et al. | 257/664 |
| 5,903,239 A | * | 5/1999 | Takahashi et al. | 343/700 MS |
| 6,035,712 A | * | 3/2000 | Ohta et al. | 73/493 |
| 6,091,144 A | * | 7/2000 | Harada | 257/724 |
| 6,396,154 B1 | * | 5/2002 | Hikita et al. | 257/778 |
| 6,518,659 B1 | * | 2/2003 | Glenn | 257/704 |
| 6,853,067 B1 | * | 2/2005 | Cohn et al. | 257/704 |

FOREIGN PATENT DOCUMENTS

| DE | 42 32 258 | 4/1993 |
|---|---|---|
| JP | 2-105557 | 4/1990 |

* cited by examiner

Primary Examiner—Minhloan Tran
Assistant Examiner—Victor A. Mandala, Jr.
(74) Attorney, Agent, or Firm—Oblon, Spivak, McClelland, Maier & Neustadt, P.C.

(57) ABSTRACT

A highly reliable semiconductor device less susceptible to external noise is provided. The semiconductor device has a signal output chip and a substrate. The signal output chip has one or more semiconductors and outputs a predetermined signal. The substrate has a circuit formed thereon and is electrically connected to the signal output chip. A potential of the substrate is fixed to a certain level.

14 Claims, 5 Drawing Sheets

SEMICONDUCTOR SENSOR WITH SUBSTRATE HAVING A CERTAIN ELECTRIC POTENTIAL

BACKGROUND OF THE INVENTION

1. Field of the Invention

The present invention relates to a semiconductor microdevice used for an acceleration sensor, an angular acceleration sensor, an electrostatic actuator or the like.

2. Description of the Background Art

FIG. 7 is a cross-sectional view which shows a structure of a conventional semiconductor microdevice 70. Semiconductor microdevice 70 is packaged so as to realize predetermined functions and operations. Semiconductor microdevice 70 is provided with two types of chips on a die pad 13 in a package. To be specific, the chips are a microstructure chip 71 provided on a chip substrate 74 and an application specific IC chip (to be referred to as "ASIC" (Application Specific Integrated Circuit) hereinafter) 72. These chips are appropriately selected according to the purpose of semiconductor microdevice 70. Microstructure chip 71 is electrically connected to chip substrate 74. Chip substrate 74 is connected to ASIC 72 by a bonding wire 75. ASIC 72 is also connected to a lead 17 a bonding wire 76. By connecting lead 17 to a circuit or the like outside of the package, power is supplied to microstructure chip 71 and ASIC 72 to enable these chips 71 and 72 to operate. It is noted that die pad 13 and chip substrate 74 are fixed to each other and die pad 13 and ASIC 72 are fixed to each other through resin layers 78, respectively.

There has been known hitherto a capacitive type inertial sensor made by a semiconductor micromachining technique as a sensor for detecting acceleration or the like. FIGS. 8A and 8B show a microstructure chip 80 used in the capacitive type inertial sensor. To be specific, FIG. 8A is a top view of microstructure chip 80 and FIG. 8B is a cross-sectional view of microstructure chip 80.

Microstructure chip 80 detects the capacitance of a capacitor formed by electrodes 82 and 83 suspended on a silicon substrate 81. Electrode 82 is a fixed electrode which is fixed to substrate 81. Electrode 83 is a movable electrode which can be moved relative to substrate 81 according to an inertial force. Movable electrode 83 is formed as one structure and supported by the silicon substrate 81 by beams 84. Since electrode 83 is movable relative to electrode 82, the position of electrode 83 is changed according to acceleration and the distance between electrodes 82 and 83, i.e., the capacitance of the capacitor is, therefore, changed. By detecting the change of the capacitance of the capacitor, it is possible to obtain the acceleration of an object, to which the capacitor is attached.

Since the change of the capacitance is very small (e.g., 1 pF), microstructure chip 80 is susceptible to external noise such as static electricity or radio wave. For that reason, a semiconductor microdevice (an acceleration sensor) employing conventional microstructure 80 is low in reliability.

SUMMARY OF THE INVENTION

It is an object of the present invention to provide a highly reliable semiconductor microdevice less susceptible to external noise.

A semiconductor device includes: a signal output chip which has one or more semiconductors and which outputs a predetermined signal; and a substrate which has a circuit formed thereon, said circuit electrically connected to the signal output chip. A potential of the substrate is fixed to a certain level, for example, a ground level. The signal output chip may be formed on a substrate of the signal output chip. A rear surface of the substrate of the signal output chip may have a metal layer.

According to this aspect of the present invention, it is possible to realize a high performance, highly reliable product capable of preventing the substrate and the signal output chip from being charged and avoiding the influence of disturbance such as static electricity and radio interference.

A semiconductor device includes: a signal output chip which has one or more semiconductors and which outputs a predetermined signal; a substrate which has a circuit formed thereon, said circuit electrically connected to the signal output chip; and a die pad, to which the substrate fixedly attached by a conductive material. A potential of the die pad is fixed to a certain level. The conductive material may be a conductive resin. The conductive material may be a conductive metal. The signal output chip may be formed on a substrate of the signal output chip. A rear surface of the substrate of the signal output chip may have a metal layer.

According to this aspect of the present invention, it is possible to realize a high performance, highly reliable product capable of preventing the substrate and the signal output chip from being charged through the conductive material and avoiding the influence of disturbance such as static electricity and radio interference.

The semiconductor device further includes a signal processing chip fixedly attached to the die pad by a conductive material. The signal processing chip processing the signal outputted from the signal output chip. By applying a ground potential level to the signal processing chip, potentials of the die pad and the substrate are fixed to the certain ground potential level. The conductive material may be a conductive resin. The conductive material may be a conductive metal.

According to this aspect of the present invention, it is possible to realize a high performance, highly reliable product capable of preventing the substrate and the signal output chip from being charged through the conductive material and avoiding the influence of disturbance such as static electricity and radio interference.

The die pad may be arranged at a position farther from a side of the substrate, on which the semiconductor device is mounted, than the signal output chip, the substrate and the signal processing chip.

According to the present invention, the semiconductor device can exhibit a shielding effect for shielding the die pad from disturbance such as radio interference.

A semiconductor device includes: a signal output chip which has one or more semiconductors and which outputs a predetermined signal; a substrate which has a circuit formed thereon, said circuit electrically connected to the signal output chip; a signal processing chip which processes the signal outputted from the signal output chip; and a conductive layer formed on a surface of the signal processing chip, and having a conductive property, said conductive layer fixedly attached to the substrate by a conductive material. By fixing a potential of the conductive layer to a certain level, a potential of a surface, which the signal output chip and the substrate contacts, is fixed to the certain level. The signal output chip may be formed on a substrate of the signal output chip. A rear surface of the substrate of the signal output chip may have a metal layer.

According to this aspect of the present invention, the potential of the surface on which the signal processing chip contacts with the substrate is fixed to the certain value. It is, therefore, possible to realize a high performance, highly reliable product capable of preventing the substrate and the signal output chip from being charged and avoiding the influence of disturbance such as static electricity and radio interference.

BRIEF DESCRIPTION OF THE DRAWINGS

This and other objects and features of the present invention will become clear from the subsequent description of a preferred embodiment thereof made with reference to the accompanying drawings, in which like parts are designated by like reference numerals and in which:

FIG. 8A is a top view of the microstructure chip and FIG. 8B is a cross-sectional view of the microstructure chip.

DETAILED DESCRIPTION OF THE PREFERRED EMBODIMENTS

The embodiments of the present invention will be described hereinafter with reference to the accompanying drawings.

(First Embodiment)

Figure 1A:
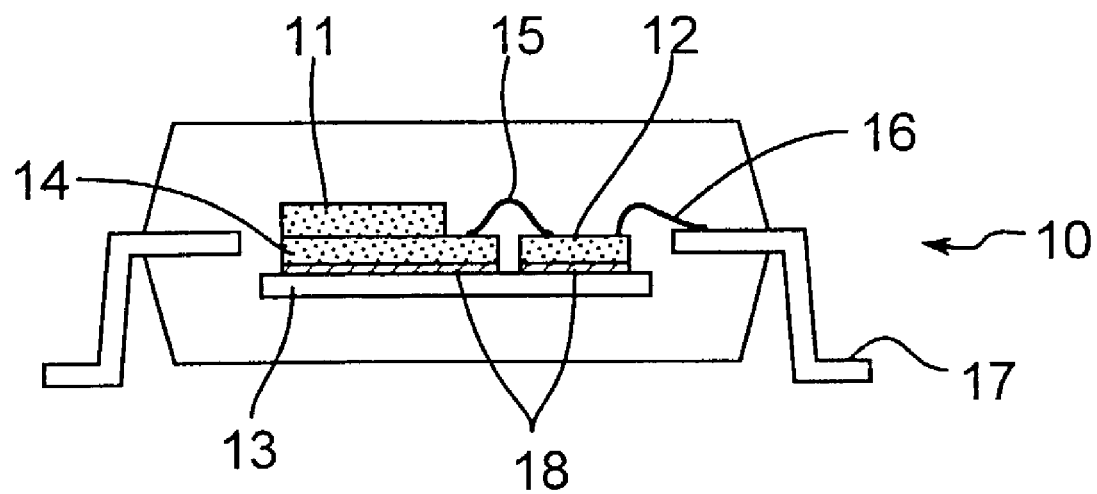
FIGS. 1A and 1B are cross-sectional views of a configuration of a semiconductor microdevice in the first embodiment according to the present invention.
Figure 1B:
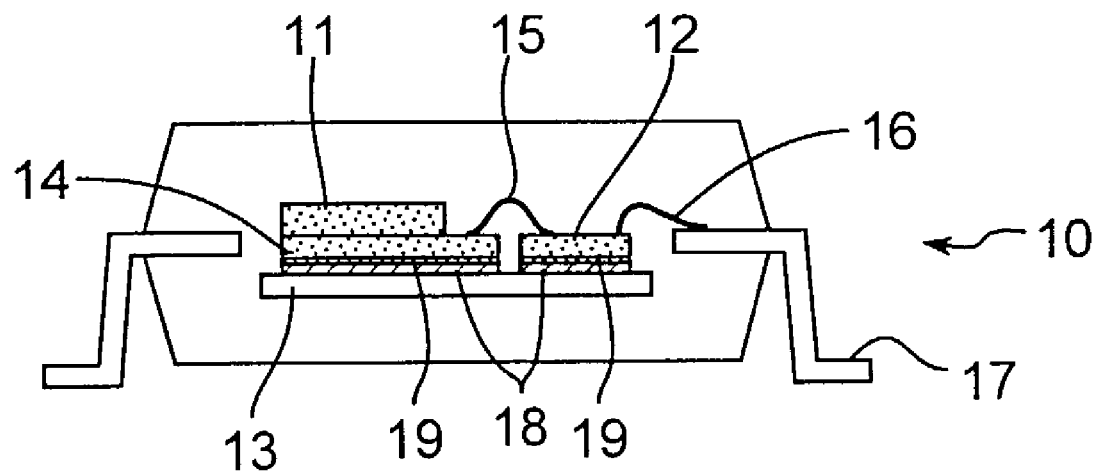

FIGS. 1A and 1B are cross-sectional views which show a configuration of a semiconductor microdevice 10 in the first embodiment according to the present invention. Semiconductor microdevice 10 is packaged so as to realize predetermined functions and operations. Semiconductor microdevice 10 functions as, for example, an acceleration sensor.

Referring to FIG. 1A, semiconductor microdevice 10 has two types of chips provided on a die pad 13 in a package. More specificaly, these chips are a microstructure chip 11 having a microstructure and mounted on a chip substrate 14 and an application specific IC chip 12 for signal processing (to be referred to as "ASIC" (Application Specific IC) hereinafter). If semiconductor microdevice 10 is, for example, an acceleration sensor, microstructure chip 11 is an acceleration sensor chip, which outputs a detected signal. On the other hand, ASIC 12 processes the signal outputted from microstructure chip 11 and outputs a detection signal representing acceleration to the outside of the package of semiconductor microdevice 10. It is noted that semiconductor microdevice 10 is not limited to the acceleration sensor and the internal chips thereof are appropriately selected according to the purpose of semiconductor chip 10. The present invention provides semiconductor microdevice 10 made by surface micro machining, by which microstructure chip 11 is formed on the silicon substrate.

Figure 8A:
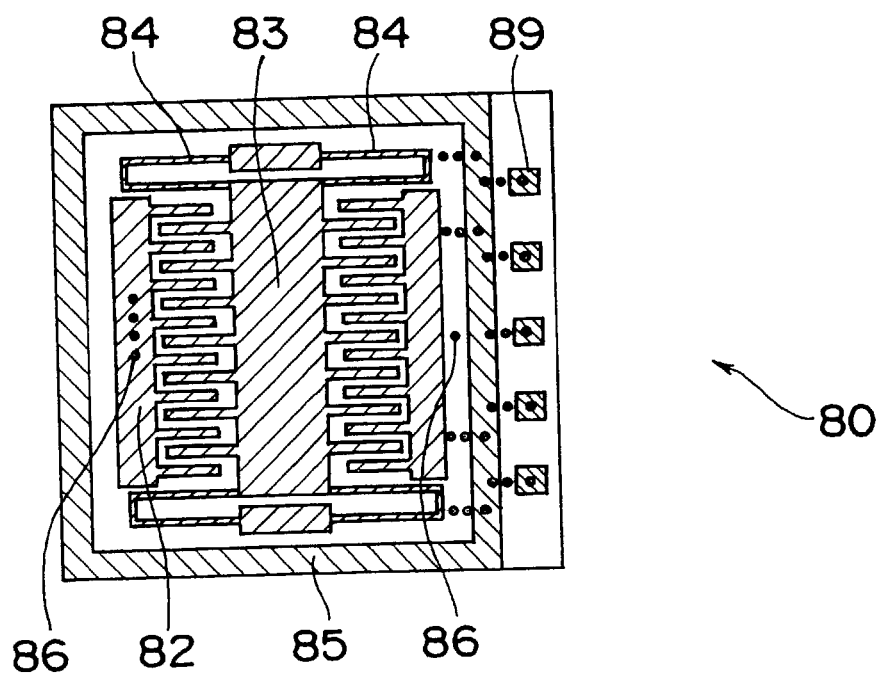
FIGS. 8A and 8B show a configuration of a microstructure chip used for a capacitive type inertial sensor, where
Figure 8B:
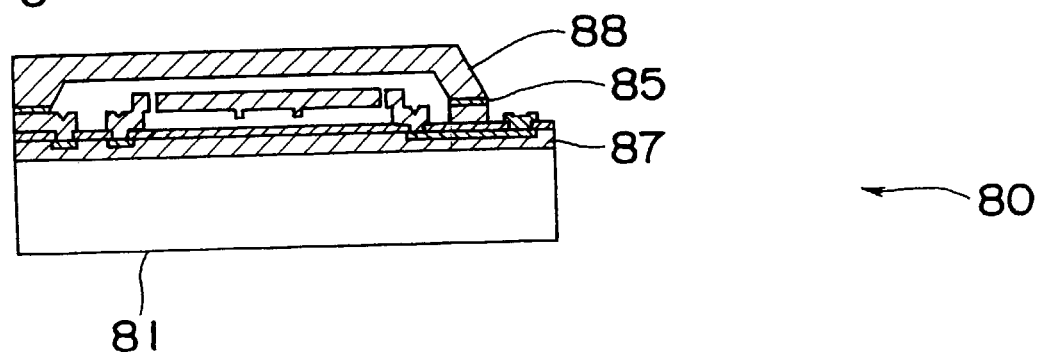

A predetermined one or more electric circuits are formed on chip substrate 14. At least one electric circuit is electrically connected to microstructure chip 11. Chip substrate 14 is made of silicon. Microstructure chip 11 has a movable section (movable electrode 83) and a fixed section (fixed detection electrode 82), as shown in FIG. 8A, provided on chip substrate 14. Referring again to FIGS. 1A and 1B, chip substrate 14 is connected to ASIC 12 by a bonding wire 15. Further, ASIC 12 is connected to a lead 17 by a bonding wire 16. More precisely, lead 17 in the package is referred to as an internal lead and lead 17 outside of the package as an external lead. By connecting lead 17 to a power source circuit outside of the package, power is supplied to microstructure chip 11 and to ASIC 12, to enable these chips to operate.

One feature of first embodiment is to fix one or more constituent elements in a predetermined potential (e.g., ground potential). Constituent elements are susceptible to external noise to be removed. By fixing the potential, disturbance such as static electricity and radio interference can be removed, which will be described hereinafter with reference to concrete examples.

Die pad 13 is fixedly attached to chip substrate 14 and to ASIC 12 by bonding materials 18, respectively. Each of bonding materials 18 is a conductive resin such as silver epoxy resin or a conductive metal such as an Au—Si eutectic. By employing the conductive material as bonding material 18, it is possible to maintain ASIC 12, chip substrate 14 and die pad 13 to have the same potential.

Now, consideration will be given to a case where the potential of chip substrate 14 is fixed to a certain level. For example, chip 14 is connected to a terminal (a GND terminal for a reference ground potential or a terminal for a constant voltage source, which are not shown) applying a fixed potential to chip 14. For example, the terminal is on a substrate on which semiconductor microdevice 10 is provided. Normally, the internal circuit of ASIC 12 is connected to an external circuit by bonding wire 16 and lead 17. This external circuit includes the above-stated GND terminal provided on the substrate. As a result, the rear surface of ASIC 12 conductive to the internal circuit of ASIC 12 has a ground potential level. Further, since chip substrate 14 is electrically connected to the rear surface of ASIC 12, chip substrate 14 has also the ground potential level. As already stated above, since ASIC 12, chip substrate 14 and die pad 13 are maintained to have the same potential level, it is possible to prevent ASIC 12, chip substrate 14 and die pad 13 from being charged. This means that disturbance such as static electricity and radio interference can be eliminated from entire semiconductor microdevice 10 as well as chip substrate 14 and microstructure chip 11. Accordingly, by fixing the potential of chip substrate 14 to a certain level, it is possible to realize a product having high reliability and high performance without the influence of disturbance such as static electricity and radio interference.

Figure 2:
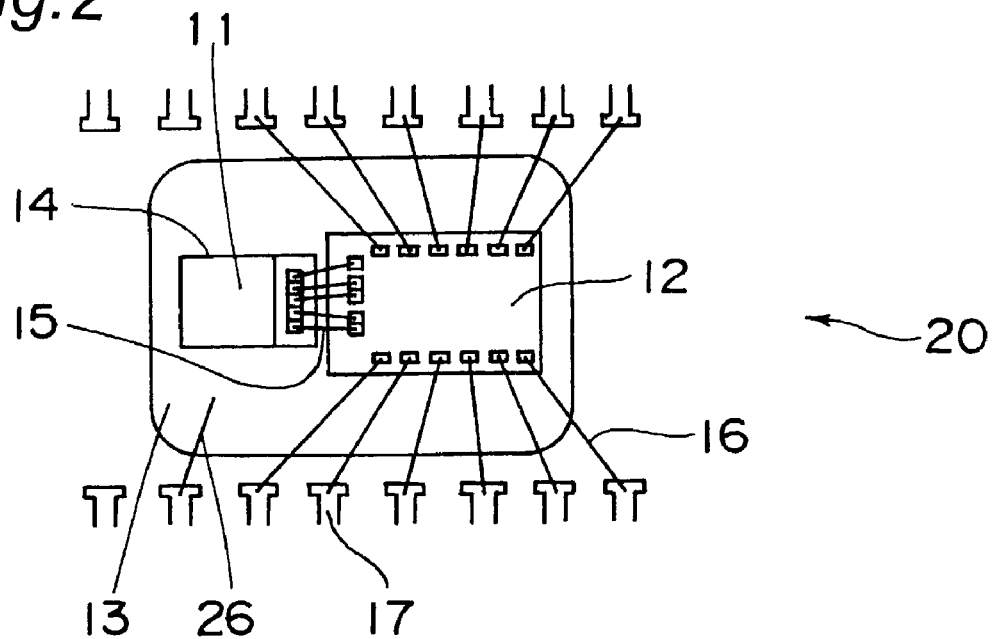
FIG. 2 is a top view of a semiconductor microdevice having a die pad and an internal lead connected to each other by a bonding wire.
Figure 3:
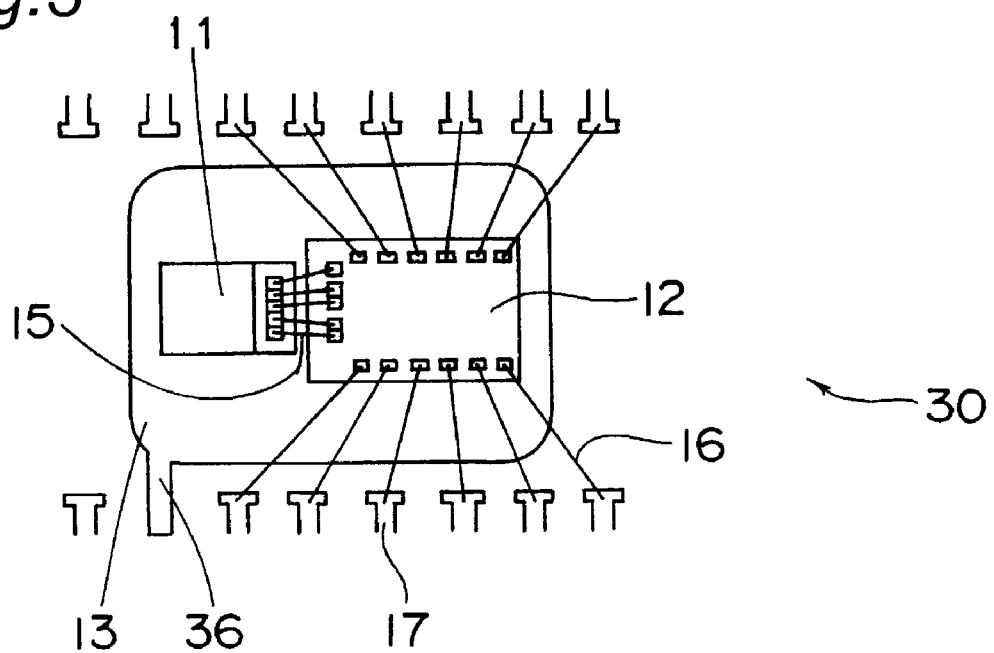
FIG. 3 is a top view of a semiconductor microdevice having an internal lead connected to a die pad.

Needless to say, in the above description, while the potential of chip substrate 14 is fixed to a certain level, the potential of die pad 13 or ASIC 12 can be fixed. When the potential of die pad 13 is fixed to a certain level, die pad 13 is connected to the external lead applying the certain potential, i.e., the package external portion of lead 17 through ASIC 12 and bonding wire 16 as shown in FIGS. 1A and 1B. Alternatively, die pad 13 is directly connected to inner lead 17 and then to the external lead. FIGS. 2 and 3 show examples of the direct connection. To be specific, FIG. 2 is a top view which shows semiconductor microdevice 20 wherein die pad 13 is connected inner leads 17 by bonding wires 26. FIG. 3 is a top view which shows semiconductor device 30 having an internal lead 36 connected to die pad 13. By such direct connection, the semiconductor microdevice can exhibit the same advantage as that described above.

Now, as shown in FIG. 1B, a metal layer 19 may be provided on the rear surface of the chip substrate and/or the substrate on which the ASIC is formed. By providing metal layer 19, it is possible to further ensure fixing the potential of the substrate. This metal layer can be formed by, for example, the sputtering method or deposition method using Au or Ti—Ni—Au. When the potential of the chip substrate is fixed to a certain level, the metal layer is preferably provided on the rear surface of the chip substrate. On the other hand, when the potential of the rear surface of the ASIC is fixed to a certain level, the metal layer is preferably provided on the rear surface of the ASIC.

(Second Embodiment)

In the second embodiment, description will be given to a semiconductor microdevice wherein microstructure chip 11 and ASIC 12 are arranged differently from those in the first embodiment.

Figure 4:
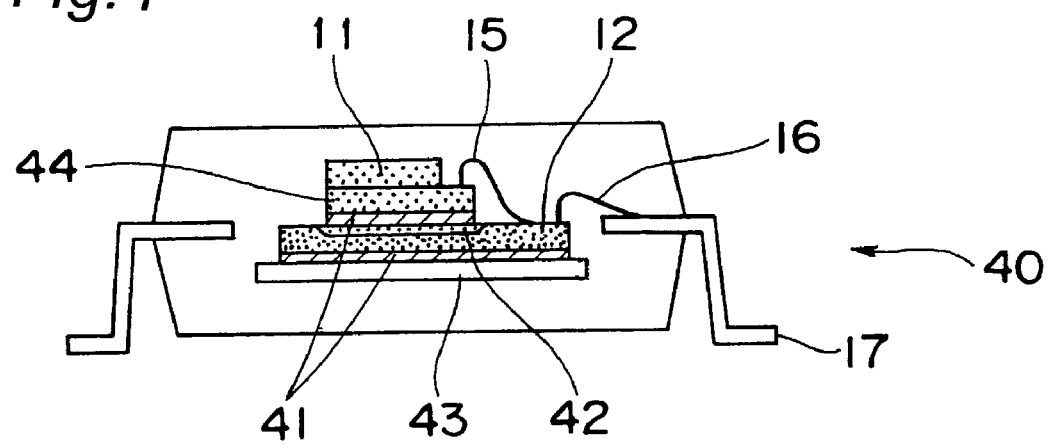
FIG. 4 is a cross-sectional view of a configuration of a semiconductor microdevice in the second embodiment according to the present invention.

FIG. 4 is a cross-sectional view which shows a configuration of a semiconductor microdevice 40 in the second embodiment. Semiconductor microdevice 40 is a device of a stack structure in which one or more chips having a microstructure are arranged on a signal processing circuit ASIC. More specifically, a bonding material 41, an ASIC 12, a conductive layer 42, a bonding material 41, a chip substrate 44 and a microstructure chip 11 are stacked on a lowermost die pad 43 in this order. Each of bonding materials 41 is a conductive resin such as a silver epoxy resin or a conductive metal such as an Au—Si eutectic as in the case of bonding materials 18 in the first embodiment. The connection between ASIC 12 and chip substrate 44 and that between ASIC 12 and a lead 17 are established by bonding wires 15 and 16, respectively.

In the first embodiment, consideration has been given to a case where the potential of chip substrate 14 is fixed to a certain level. In the second embodiment, by contrast, consideration will be given to a case where the potential of conductive layer 42 provided on the surface region of ASIC 12 is fixed to a certain level. In this case, since bonding materials 41 are conductive and chip substrate 44 is electrically connected to one of bonding materials 41 and microstructure chip 11, the potential of the rear surface of microstructure chip 11 is also fixed to the level. Consequently, the second embodiment can obtain the same advantage as that of the first embodiment, i.e., the second embodiment can realize a product having high performance and high reliability without the influence of disturbance such as static electricity and radio interference.

Figure 5:
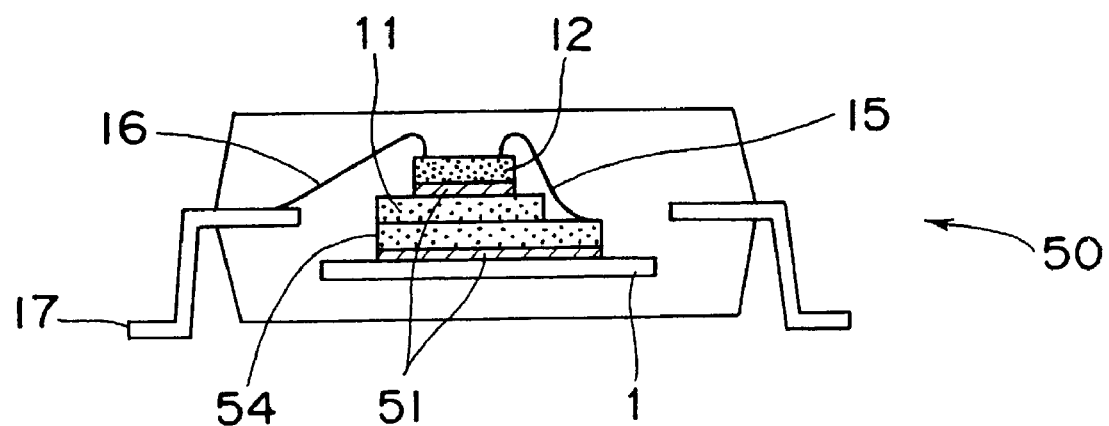
FIG. 5 is a cross-sectional view of a configuration of another semiconductor microdevice in the second embodiment.

It is noted that the positional relationship among ASIC 12, chip substrate 44 and microstructure chip 11 should not be limited to that described above. FIG. 5 is a cross-sectional view which shows a configuration of another semiconductor device 50 in the second embodiment. The differences of semiconductor microdevice 50 from semiconductor microdevice 40 (FIG. 4) are that the positions of an ASIC 12, a chip substrate 54 and a microstructure chip 11 are changed and that conductive layer 42 (FIG. 4) is not provided.

In semiconductor microdevice 50, if the potential of the surface of microstructure chip 11 is set to be equal to that of chip substrate 54 (e.g., GND level) and the potential of ASIC 12 is also set to be equal to that of chip substrate 54, then the same advantage as that described above can be obtained.

As described above in the first embodiment with reference to FIG. 1B, a metal layer may be provided on the rear surface of the chip substrate and/or the substrate on which the ASIC is formed. By providing the metal layer, it is possible to further ensure fixing the potential of the substrate.

(Third Embodiment)

In the third embodiment, description will be given to a semiconductor microdevice wherein a microstructure chip 11 and an ASIC 12 are arranged differently from the first and second embodiments.

Figure 6:
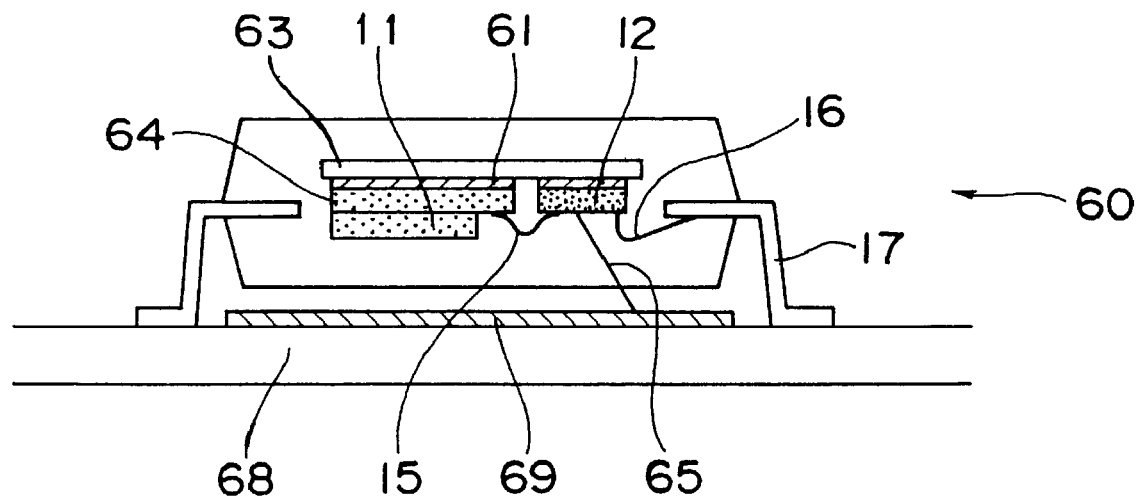
FIG. 6 is a cross-sectional view of a configuration of a semiconductor microdevice in the third embodiment according to the present invention.
Figure 7:
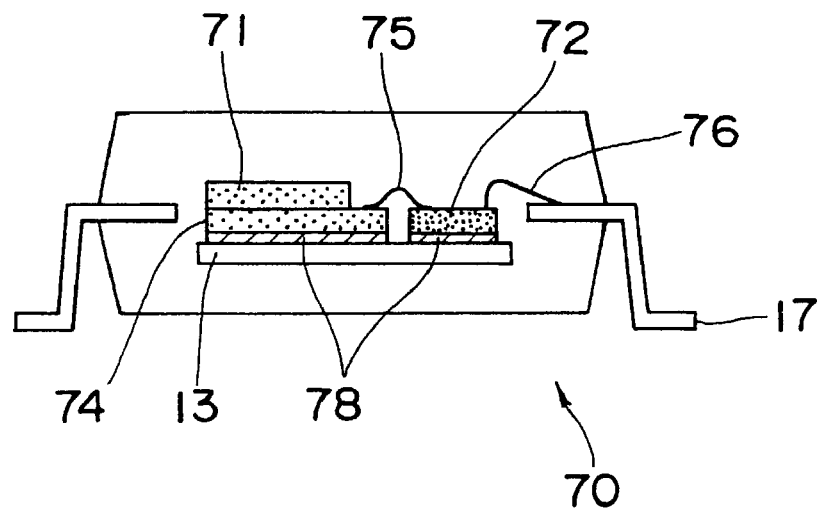
FIG. 7 is a cross-sectional view of a configuration of a conventional semiconductor microdevice.

FIG. 6 is a cross-sectional view which shows a configuration of a semiconductor microdevice 60 in the third embodiment. Semiconductor microdevice 60 is configured by vertically inverting the package of semiconductor microdevice 10 (FIG. 1). Consequently, an external lead 17 is bent oppositely to external lead 17 of semiconductor microdevice 10 (FIG. 1). As a result, a die pad 63 is arranged at a position farther from a side on which semiconductor microdevice 60 is mounted on a mounting substrate than a microstructure chip 11, a chip substrate 64 and an ASIC 12. To be specific, in semiconductor microdevice 60, die pad 63 is arranged on the uppermost portion and a bonding material 61, chip substrate 64 and microstructure chip 11 are provided below die pad 63 in this order. Connection between ASIC 12 and chip substrate 64 and that between ASIC 12 and internal lead 17 are established by bonding wires 15 and 16, respectively.

By arranging die pad 63 on the uppermost portion of semiconductor microdevice 60, microdevice 60 can exhibit a shielding effect for shielding die pad 63 from disturbance such as radio interference. In addition, by providing a conductive pattern (GND pattern 69) on the surface facing semiconductor chip 11 of chip substrate 53 and setting the potential of chip substrate 64 at a certain level (e.g., GND level), it is possible to obtain a high performance product capable of shielding the influence of disturbance.

As described above in the first embodiment with reference to FIG. 1B, a metal layer may be provided on the rear surface of the chip substrate and/or the substrate on which the ASIC is formed. By providing the metal layer, it is possible to further ensure fixing the potential of the substrate.

What is claimed is:

1. A semiconductor device comprising:
    a substrate;
    a signal output chip which has one or more semiconductors and which outputs a predetermined signal, said signal output chip being formed on the substrate; and
    an electric circuit formed on the substrate, said electric circuit being electrically connected to the signal output chip and being configured to generate a signal that is input to the signal output chip, and said electric circuit has a movable part that generates said signal,
    wherein an electric potential of the substrate is fixed to a certain level.

2. The semiconductor device according to claim 1, wherein the electric potential of the substrate is fixed to a ground level.

3. The semiconductor device according to claim 1, wherein the signal output chip is formed on a substrate of the signal output chip, and wherein a rear surface of the substrate of the signal output chip has a metal layer.

4. A semiconductor device comprising:

a substrate;

a signal output chip which has one or more semiconductors and which outputs a predetermined signal, said signal output chip being formed on the substrate;

an electric circuit formed on the substrate, said electric circuit being electrically connected to the signal output chip and being configured to generate a signal that is input to the signal output chip, and said electric circuit has a movable part that generates said signal; and a die pad, to which the substrate is fixedly attached by a conductive material, wherein an electric potential of the die pad is fixed to a certain level.

5. The semiconductor device according to claim 4, wherein the conductive material is a conductive resin.

6. The semiconductor device according to claim 4, wherein the conductive material is a conductive metal.

7. The semiconductor device according to claim 4, wherein the signal output chip is formed on a substrate of the signal output chip, and wherein a rear surface of the substrate of the signal output chip has a metal layer.

8. A semiconductor device comprising:

means for supporting;

means for outputting a predetermined signal, said means for outputting being formed on the means for supporting; and means for generating a signal that is input to the means for outputting, the means for generating being formed on the means for supporting and being electrically connected to the means for outputting, said means for generating including a movable part that generates said signal, wherein an electric potential of the means for supporting is fixed to a certain level.

9. The semiconductor device according to claim 8, wherein the electric potential of the means for supporting is fixed to a ground level.

10. The semiconductor device according to claim 8, wherein the means for outputting is formed on means for supporting the means for outputting, and wherein a rear surface of the means for supporting the means for outputting has a metal layer.

11. A semiconductor device comprising:

means for supporting;

means for outputting a predetermined signal formed on the means for supporting;

means for generating a signal that is input to the means for outputting, the means for generating being formed on the means for supporting and being electrically connected to the means for outputting, said means for generating including a movable part that generates said signal; and a die pad to which the means for supporting is fixedly attached by a conductive material, wherein an electric potential of the die pad is fixed to a certain level.

12. The semiconductor device according to claim 11, wherein the conductive material is a conductive resin.

13. The semiconductor device according to claim 11, wherein the conductive material is a conductive metal.

14. The semiconductor device according to claim 11, wherein the means for outputting is formed on means for supporting the means for outputting, and wherein a rear surface of the means for supporting the means for outputting has a metal layer.

* * * * *